United States Patent
Dubelloy et al.

[11] Patent Number: 5,883,431
[45] Date of Patent: Mar. 16, 1999

[54] DEVICE WITH POWER SEMICONDUCTOR COMPONENTS

[75] Inventors: Jean-Luc Dubelloy, Tarbes; Serge Donnet, Aix les Bains; Bernard Compagnet, Soues; Gérard Scali, Odos, all of France

[73] Assignee: Gec Alsthom Transport SA, Paris, France

[21] Appl. No.: 855,887

[22] Filed: May 12, 1997

[30] Foreign Application Priority Data

May 14, 1996 [FR] France .................................. 96 05990

[51] Int. Cl.⁶ .............................. H01L 23/34; H01L 23/02
[52] U.S. Cl. ......................... 257/718; 257/686; 257/726; 257/727
[58] Field of Search ..................... 257/718, 686, 257/726, 727

[56] References Cited

U.S. PATENT DOCUMENTS

| | | | |
|---|---|---|---|
| 3,447,118 | 5/1969 | Ferree | 257/686 |
| 3,603,381 | 9/1971 | Scherbaum | 257/686 |
| 4,023,616 | 5/1977 | Scherbaum | 257/686 |
| 4,338,652 | 7/1982 | Romanczuk et al. | 257/686 |
| 4,347,543 | 8/1982 | Frister et al. | 257/686 |

FOREIGN PATENT DOCUMENTS

| | | | |
|---|---|---|---|
| 54-116638 | 9/1979 | Japan | 257/686 |
| 1009359 | 7/1962 | United Kingdom . | |
| 1121395 | 7/1968 | United Kingdom | 257/686 |
| 2094547 | 9/1982 | United Kingdom . | |
| 2221793 | 2/1990 | United Kingdom . | |

OTHER PUBLICATIONS

Patent Abstracts of Japan, Vo. 5, No. 159 (E–77) [831], 14 Oct. 1981 corresponding to JP–A–56 088324 (MitsubishiDenki K.K.) 17 Jul. 1981.

*Primary Examiner*—Mahshid D. Saadat
*Assistant Examiner*—Jhihan B. Clark
*Attorney, Agent, or Firm*—Sughrue, Mion, Zinn, Macpeak & Seas, PLLC

[57] ABSTRACT

A device with power semiconductor components includes, in combination: a stack alternately comprising at least one power semiconductor component and at least one heatsink to dissipate heat and to provide an electrical connection, at least a first system for clamping the power semiconductor components, at least a second system for clamping components protecting the power semiconductor components, at least one spacer for insulating the semiconductor components from the framework of the various modules and at least one conductive block replacing heatsinks that are rendered unnecessary by the arrangement chosen for the inverter and auxiliary chopper functions.

11 Claims, 1 Drawing Sheet

5,883,431

DEVICE WITH POWER SEMICONDUCTOR COMPONENTS

BACKGROUND OF THE INVENTION

1. Field of the Invention

The present invention concerns the disposition of power semiconductor components in general and more particularly a device with power semiconductor components.

2. Description of the Prior Art

Static converters and power semiconductors require energetic cooling to dissipate sufficient calories.

Prior art static converters and power semiconductors have an architecture in which the semiconductor components are not all disposed on a single axis.

Static converters including thyristors, gate turn off (GTO) thyristors, diodes and protective semiconductors have a topology such that the axes of the semiconductors are either parallel or intersect each other, but are never all on the same axis.

A prior art arrangement of the semiconductor components of this kind has the disadvantage of requiring at least one semiconductor clamping system for each axis, leading to high cost, weight and volume.

Moreover, a prior art design of power modules requiring a plurality of axes prevents the use of simple wiring to connect all of the semiconductors.

This type of wiring can become very complex and can result in a system in which it is difficult to minimize the inductance of the wiring.

Consequently, the performance of this type of converter can be degraded by the use of these wiring methods.

To minimize the cooling system, modules which have a two-axis or multi-axis design have an architecture adapted to suit the electrical function.

It follows from the foregoing that the mechanical design, the wiring and the cooling method are each adapted to suit each of the functions of the modules.

In other words, an inverter type module, a forced switching hybrid bridge type module and an auxiliary chopper type module each have their own mechanical design, wiring and cooling method.

If the circuit has other functions, these functions are also treated differently. One example of the use of such power modules is in a traction system type application.

An aim of the invention is a device with power semiconductor components enabling the number of heatsinks required to cool components assuring the complete function of the various converters to be minimized.

In other words, the present invention is more particularly directed at an installation having an architecture such that the semiconductor cooling system can be minimized.

An advantage of this type of installation is that the volume is optimized because the electronic power components are installed on the same axis.

By installing the components in a manner suited to their level of losses, but on a single axis, the number of heatsinks in the inverter and auxiliary chopper functions is reduced compared to the forced switching hybrid bridge function.

The single-axis arrangement has the advantage of standardizing all of the mechanical design features for all of the various modules. Another advantage of an arrangement of this kind is that it uses the same wiring for all three functions: inverter, auxiliary chopper and forced switching hybrid bridge.

SUMMARY OF THE INVENTION

The invention consists in a device with power semiconductor components comprising in combination:

a stack alternately comprising at least one power semiconductor component and at least one heatsink to dissipate heat and to provide an electrical connection, a framework for holding the stack, at least a first system for clamping the power semiconductor components, at least a second system for clamping components protecting the power semiconductor components, at least one spacer for insulating the semiconductor components from the framework of the various modules, and at least one conductive block replacing heatsinks that are rendered unnecessary by the arrangement chosen for the inverter and auxiliary chopper functions.

The device of the invention with power semiconductor components also has at least one of the following features:

the entire device is disposed along a single axis, the entire device is held in a framework comprising:

a support plate providing a base for the power semiconductor components and for the protection semiconductor components, a first locating plate for mounting the first clamping system, two columns associated with the support plate and with the first locating plate. The framework, by virtue of the first clamping system, applies the force required for correct operation of the power semiconductor components, the protection semiconductor components are held by a second locating plate, which mounts the second clamping system, two screwthreaded tie-rods and the support plate, the power semiconductor components are diodes or GTO thyristors or protection diodes.

Other aims, features and advantages of the invention will emerge from a reading of the description of the preferred embodiment of the device with power semiconductor components given with reference to the drawings.

DETAILED DESCRIPTION OF THE PREFERRED EMBODIMENT

Figure 3:
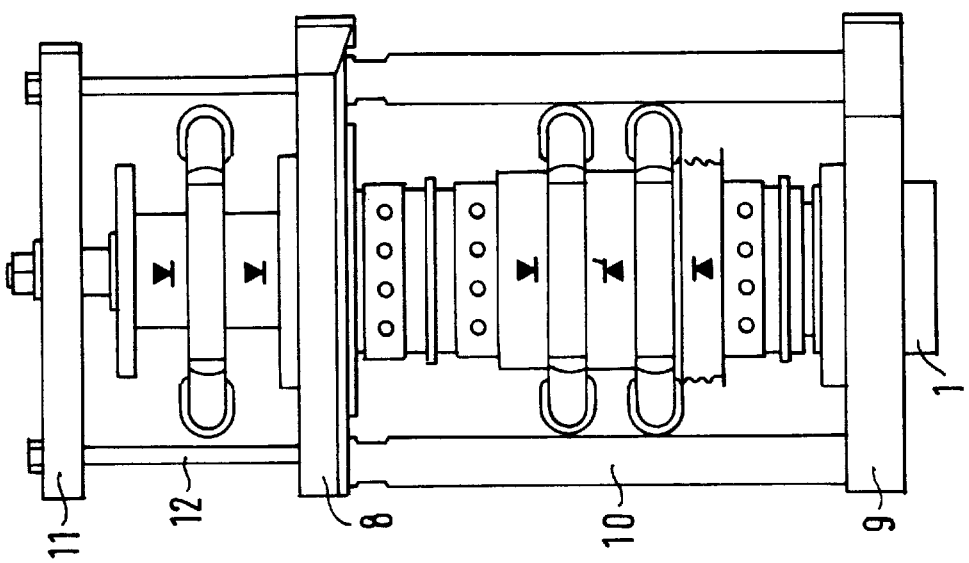
FIG. 3 shows an auxiliary chopper type device in accordance with the invention having power semiconductor components.
Figure 2:
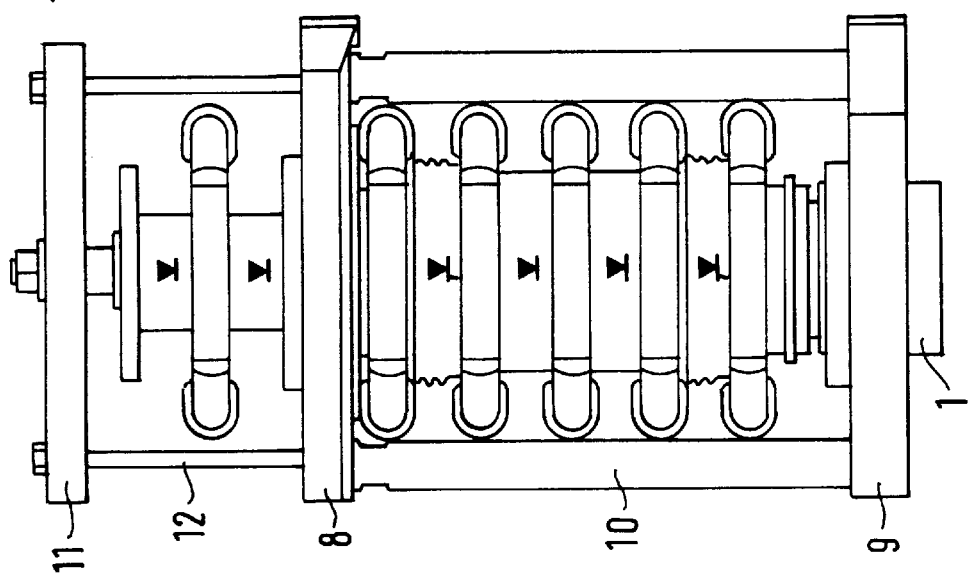
FIG. 2 shows a forced switching hybrid bridge type device in accordance with the invention having power semiconductor components.
Figure 1:
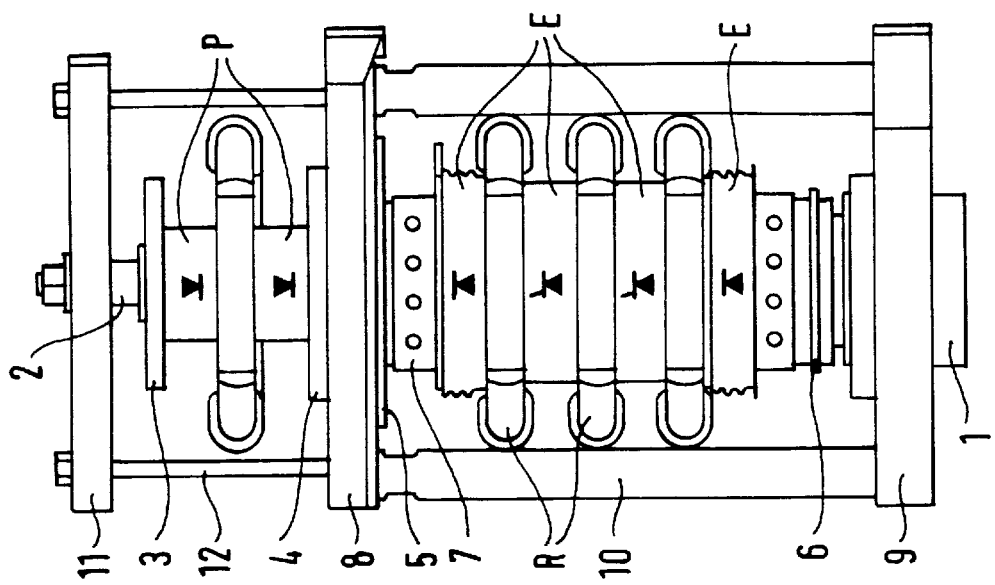
FIG. 1 shows an inverter type device in accordance with the invention having power semiconductor components.

FIGS. 1 through 3 respectively show a device in accordance with the invention of the inverter, forced switching hybrid bridge and auxiliary chopper type and having power semiconductor components.

The device with power semiconductor components comprises, in combination:

a stack alternately comprising at least one power semiconductor component E and at least one heatsink R to dissipate heat and to provide an electrical connection, a framework for holding the stack, at least a first system 1 for clamping the power semiconductor components, at least a second system 2 for clamping components protecting the power semiconductor components, at least one spacer 3, 4, 5, 6 for insulating the semiconductor components from the framework of the various modules, at least one aluminum conductive block 7 replacing heatsinks R that are rendered unnecessary by the mode of arrangement chosen for the inverter and auxiliary chopper functions.

The entire device is disposed along a single axis.

In a preferred embodiment, the entire device is held within a framework which includes:

a support plate 8 providing a base for the power semiconductor components and for the protection semiconductor components, a locating plate 9, which mounts the first clamping system, two columns 10 associated with the support plate 8 and with the locating plate 9. The framework, by virtue of said first clamping system 1, applies the force required for correct operation of the power semiconductor components.

The protection semiconductor components P are held to the framework by a locating plate 11, which mounts the second clamping system 2 in position so that it contributes to the transmission of force on the protection semiconductor components P. Two screwthreaded tie-rods 12 connect the locating plate 11 to the support plate 8.

The power semiconductor components E are diodes or GTO thyristors or protection diodes.

The spacers 3, 4, 5, 6 are preferably made from composite materials.

The conductive blocks 7 are preferably made from aluminum.

The various components described hereinabove are all identical for the three functions, only the combination of the arrangement of certain components providing different modules whilst minimizing the number of heat sinks.

It follows from the foregoing that the device with power semiconductor components comprises on a single axis and in combination:

main and protection power semiconductor components, identical heatsinks to dissipate heat, and insulative or conductive spacers.

The position of the power semiconductor components depends on their losses associated with the type of converter.

The mechanical framework and the wiring are exactly the same for the three functions: inverter, auxiliary chopper and forced switching hybrid bridge.

There is claimed:

1. A device with power semiconductor components comprising in combination:

a stack alternately comprising at least one power semiconductor component and at least one heatsink to dissipate heat and to provide an electrical connection, a framework for holding said stack, at least a first system for clamping said power semiconductor components, said first clamping system being connected to said framework, at least a second system for clamping protection semiconductor components which protect said power semiconductor components, said second clamping system being connected to said framework, at least one spacer for insulating said semiconductor components from the framework, and at least one conductive block replacing heatsinks that are rendered unnecessary by the arrangement chosen for the inverter and auxiliary chopper functions.

2. The device claimed in claim 1, in combination with the protection semiconductor components, wherein the stack and the protection semiconductor components are disposed along a single axis.

3. The device claimed in claim 1 wherein the framework comprises:

a support plate providing a base for said power semiconductor components and for the protection semiconductor components, a first locating plate connected to said first clamping system, and two columns, each column being associated with said support plate and with said first locating plate, wherein said framework, by virtue of said first clamping system, applies the force required for correct operation of said power semiconductor components.

4. The device claimed in claim 1, in combination with the protection semiconductor components, wherein:

said framework includes a support plate, said second clamping system is mounted to said support plate by a second locating plate and two screwthreaded tie-rods, each of said screwthreaded tie-rods being connected to said second locating plate and said support plate, and said second clamping system applies force to the protection semiconductor components such that said protection semiconductor components are held between said second locating plate and said support plate.

5. The device claimed in claim 1 wherein said power semiconductor components are diodes or GTO thyristors or protection diodes.

6. The device claimed in claim 1 wherein said at least one spacer is made from a composite material.

7. The device claimed in claim 1 wherein said at least one conductive block is made of aluminum.

8. The device claimed in claim 3 wherein said at least one spacer is located on a face of said support plate.

9. The device claimed in claim 3, in combination with the protection semiconductor components, wherein said second clamping system is mounted to said support plate by a second locating plate and two screwthreaded tie-rods, each of said screwthreaded tie-rods being connected to said second locating plate and said support plate, and wherein said second clamping system applies force to the protection semiconductor components such that said protection semiconductor components are held between said second locating plate and said support plate.

10. The device claimed in claim 9, wherein said columns and said tie-rods extend from opposite sides of said support plate.

11. The device claimed in claim 9, wherein said support plate is located between said first and second locating plates.

* * * * *